(12) United States Patent
Lim

(10) Patent No.: US 7,041,597 B2
(45) Date of Patent: May 9, 2006

(54) SEMICONDUCTOR DEVICE HAVING VOID FREE CONTACT AND METHOD FOR FABRICATING THE CONTACT

(75) Inventor: Bi-O Lim, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/893,618

(22) Filed: Jul. 15, 2004

(65) Prior Publication Data

US 2005/0014358 A1    Jan. 20, 2005

(30) Foreign Application Priority Data

Jul. 16, 2003    (KR)    ............... 10-2003-0048772

(51) Int. Cl.
*H01L 21/44*    (2006.01)

(52) U.S. Cl. .................. 438/672; 438/673; 438/709
(58) Field of Classification Search .................. None
See application file for complete search history.

(56) References Cited

U.S. PATENT DOCUMENTS

| | | | |
|---|---|---|---|
| 5,747,379 A | | 5/1998 | Huang et al. |
| 5,807,660 A | * | 9/1998 | Lin et al. ............... 430/313 |
| 6,025,269 A | | 2/2000 | Sandhu |
| 6,528,412 B1 | * | 3/2003 | Wang et al. ........... 438/628 |

* cited by examiner

*Primary Examiner*—David Nelms
*Assistant Examiner*—Long Tran
(74) *Attorney, Agent, or Firm*—Andrew D. Fortney

(57) ABSTRACT

The present invention relates to a semiconductor device and a method for fabricating a contact of the semiconductor device, and in particular, to the method for fabricating a semiconductor contact of the device for electrically coupling upper and lower metal wires or coupling an electrode and a metal wire and a method for fabricating the contact. The method includes forming an interlayer insulating layer on a semiconductor substrate; forming a contact hole by selectively removing the interlayer insulating layer; forming a barrier metal layer on a surface of the interlayer insulating layer, increasing roughness of a surface of the barrier layer at an area around an inlet of the contact hole; and forming a contact by filling the contact hole with a conductive material. According to this method, the conductive layer is slowly deposited around the inlet of the contact hole relative to the other areas of the contact bole, such that it is possible to form a void free contact with a high aspect ratio.

17 Claims, 3 Drawing Sheets

SEMICONDUCTOR DEVICE HAVING VOID FREE CONTACT AND METHOD FOR FABRICATING THE CONTACT

CLAIM OF PRIORITY

This application makes reference to, incorporates the same herein, and claims all benefits accruing under 35 U.S.C. §119 from an application for SEMICONDUCTOR DEVICE HAVING VOID FREE CONTACT AND METHOD FOR FABRICATING THE CONTACT earlier filed in the Korean Industrial Property Office on 16 Jul. 2003 and there duly assigned Serial No. 2003-48772.

BACKGROUND OF THE INVENTION (a) Field of the Invention

The present invention relates to a semiconductor device and a method for fabricating a contact of the semiconductor device, in particular, to a semiconductor device having a contact for electrically coupling metal wires formed on different layers and/or an electrodes of the semiconductor device and the metal wire, and a method for fabricating the contact.

(b) Description of the Related Art

Typically, a semiconductor device having MOS transistor, as a field effect transistor (FET), includes a source, drain, and gate electrodes.

The method for fabricating the semiconductor device will be described hereinafter.

Firstly, a gate insulating film and gate electrode are formed on a semiconductor substrate and then a spacer is formed on the side wall of the gate followed by forming source/drain regions. After the above structured MOS transistors are formed, an interlayer insulation film is formed on the entire surface of the semiconductor substrate, and then the interlayer insulation film is planarized using a Chemical Mechanical Polishing (CMP) process.

Next, the interlayer insulation film is etched using a contact mask so as to produce contact holes exposing the source/drain regions, and then a barrier metal film is formed by depositing Ti/TiN film on the upper surface of the interlayer insulation film and the inner wall of the contact hole. Here, the barrier metal film can be formed using Physical Vapor Deposition (PVD) process or Chemical Vapor Deposition (CVD) process.

Sequentially, the contact hole is filled by depositing a conductive layer on the interlayer insulation film such as tungsten film. Here, the tungsten film can be formed using CVD process. Then, the conductive layer and the barrier metal film is polished using the CMP or blanket etch back process until the surface of the interlayer insulation film is exposed so as to form the contact which electrically connects to the source/drain regions below.

However, in the conventional contact fabrication method, it is not easy to form a contact with a high aspect ratio lager than 10:1. This is due to the seam effect in which the inlet of the contact hole is closed before the contact hole is filled out. The seam effect is caused by the step coverage limit of the tungsten film filled in the contact hole. The void formed by the seam effect degrades the electrical characteristic and productivity of the semiconductor Accordingly, there has been researches and developments for forming the contact with void. The U.S. Pat. Nos. 5,747,379 and 6,025,269 disclose the methods for fabricating the void free contacts.

SUMMARY OF THE INVENTION

The present invention has been made in an effort to solve the problem, and it is an object of the present invention to provide a semiconductor device having a void free contact with a high aspect ratio.

It is another object of the present invention to provide a method for fabricating a void free contact having high aspect ratio by improving the step coverage and adjusting deposition speed of the conductive layer by deposition areas.

In one aspect of the present invention, a semiconductor device comprises a semiconductor substrate having a source, drain, and gate electrodes; a dielectric layer formed on the semiconductor substrate; contact holes formed by selectively removing the dielectric layer at positions corresponding to the source and drain; a barrier metal layer formed on inner wall of the contact hole; and a contact formed by filling the contact hole with conductive material, wherein the barrier metal layer is formed such that a surface of the barrier metal layer around an inlet of the contact hole is more rough than at other areas of the contact hole.

In another aspect of the present invention, a method for fabricating a contact of a semiconductor device comprises the steps of forming a dielectric layer on a semiconductor substrate; forming a contact hole by selectively removing the dielectric layer, forming a barrier metal layer on a surface of the dielectric layer; increasing roughness of a surface of the barrier metal layer at an area around an inlet of the contact hole; forming a contact by filling the contact hole with a conductive material.

DETAILED DESCRIPTION OF THE PREFERRED EMBODIMENTS

A preferred embodiment of the present invention will be described hereinafter with reference to accompanying drawings.

FIG. 1A to FIG. 1F show the sequential stages for fabricating a contact of a semiconductor device according to a preferred embodiment of the present invention.

Figure 1A:
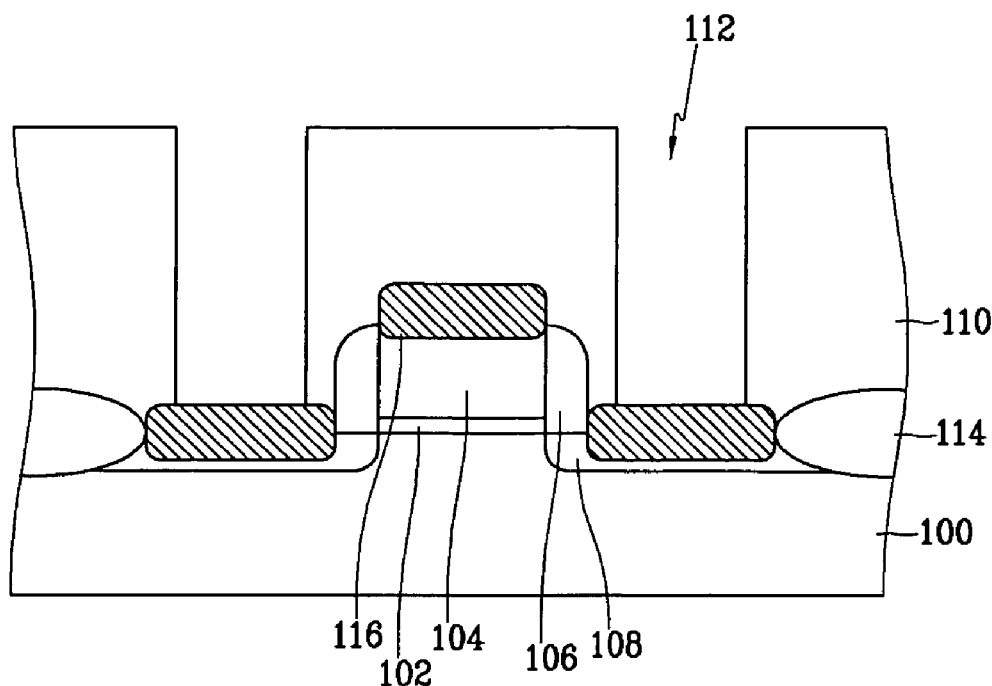
FIG. 1A to FIG. 1F are drawings illustrating sequential stages of a method for fabricating a contact of a semiconductor device according to a preferred embodiment of the present invention.

As shown in FIG. 1A, firstly a gate structure is formed by sequentially depositing a gate dielectric 102 and a gate electrode 104 on a semiconductor substrate 100 and then spacers 106 are formed on sidewalls of the gate structure. After the spacers are formed, source/drain regions 108 are formed within the semiconductor substrate 100.

Next, an interlayer insulation film 110 is deposited on the entire surface of the semiconductor substrate 100 and is planarized by CMP process.

Sequentially, the interlayer insulation film 110 is etched through an etching process using a contact mask (not shown), so that a contact hole 112 is formed.

Even though it is not depicted in drawings, the interlayer insulation film 110 formed together with the contact hole 112 is cleaned such that a native oxide layer inside the contact hole 112 is removed.

In FIG. 1A, the reference numeral 114 denotes a device isolation layer, and 116 denotes a silicide or salicide layer formed on the gate electrode 104.

Figure 1B:
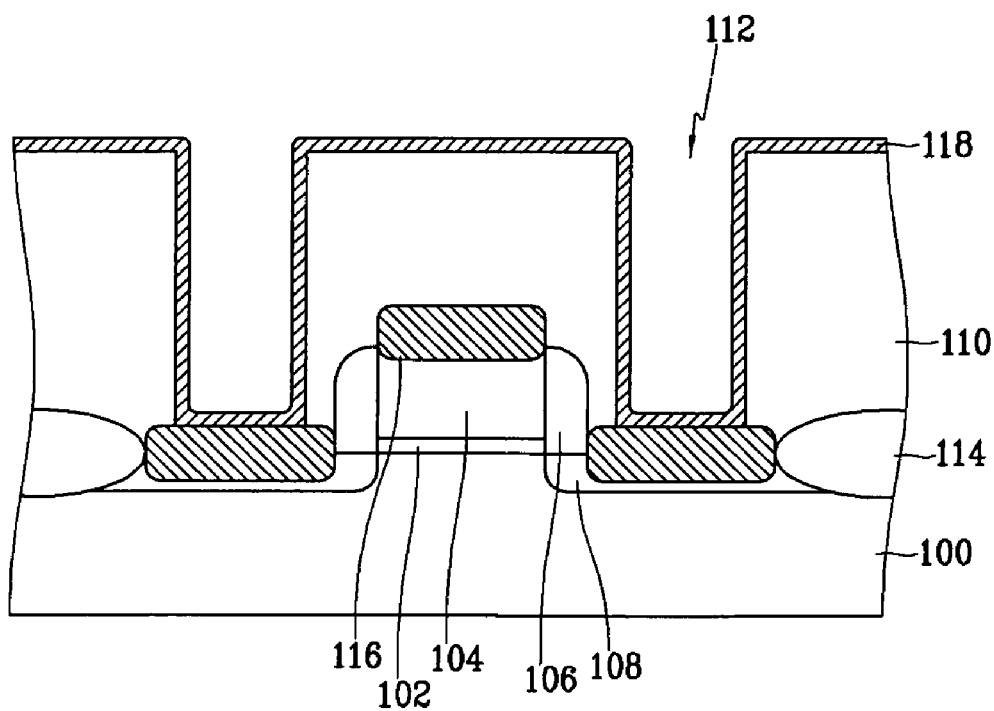

Sequentially, as shown in FIG. 1B, a barrier metal layer 118 is deposited on the surface of the interlayer insulation film 110 by means of PVD or CVD process. Here, the barrier metal layer 118 can be formed as a single layer film of Ti or TiN or can be formed as a multilayered film formed by depositing the Ti and TiN.

Not shown in the drawings, the barrier metal layer 118 can be stabilized by means of annealing process, or a silicide layer can be additionally formed at a bottom of the contact hole 112 by reacting the silicon of the source/drain region 108 with the Ti layer.

Figure 1C:
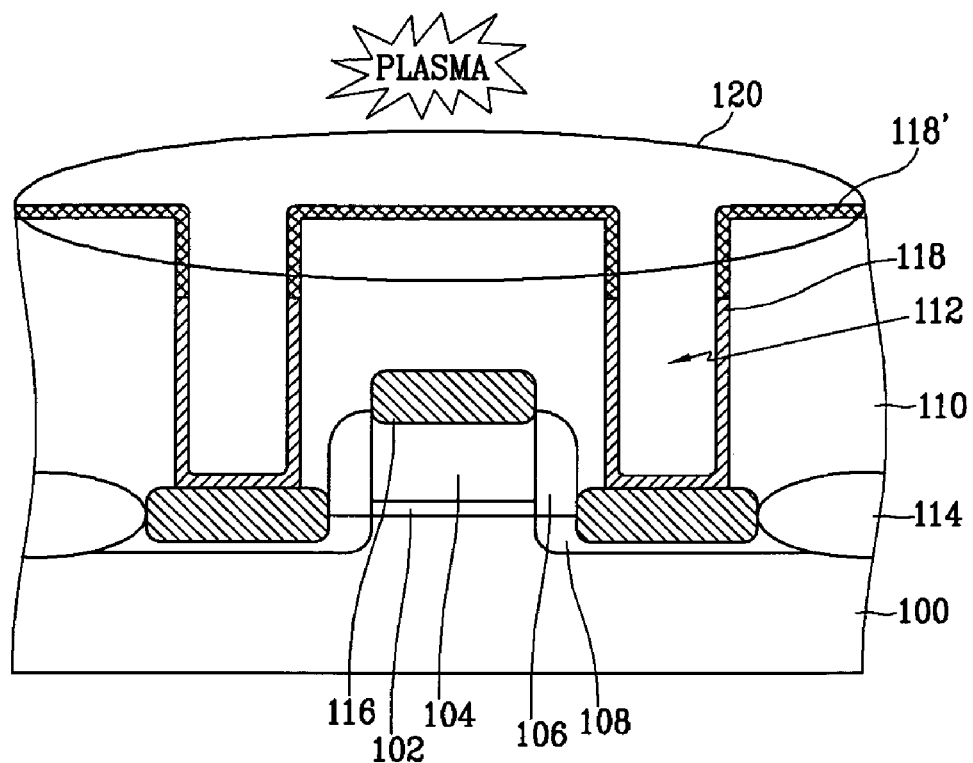

Sequentially, as shown in FIG. 1C, a plasma treatment is performed on some areas, i.e., the inlet of the contact hole 112 and to barrier metal layer 118' of the upper surface of the interlayer insulation film 110 adjacent to the contact hole 112 so as to damage the surface of the barrier metal layer 118' of that areas.

The area on which the plasma treatment is performed will be called as plasma treatment area 120 and other area will be called as non-plasma treatment area 122.

By performing the plasma treatment to the plasma treatment area 120, a roughness and a number of nucleation sires of the barrier metal layer 118' at the plasma treatment area increases so as to become larger than those of the barrier metal layer 118 at non-plasma treatment area.

Here, the nucleation site is a point where a seed is deposited on the barrier metal layer inside the contact hole 112 during an initial deposition process for filling the contact hole 112. The increase of the number of nucleation sites allows the conductive layer to be uniformly deposited.

The plasma treatment on the barrier metal layer 118' is performed with an inert ion such as Kr, Xe, Rn, Ar, He, or N2 preferably under pressure in the range of 1 mTorr~10 mTorr at a power in rho range of 50~500 W. In ease that the plasma treatment is performed with the power and pressure exceeding the above ranged conditions, the plasma treatment can make effects to the bottom of the contact bole 112. On the other hand, in case that the plasma treatment is performed with the power and pressure below the above ranged conditions, it is difficult to obtain the required roughness of the barrier metal layer 118'.

Figure 1D:
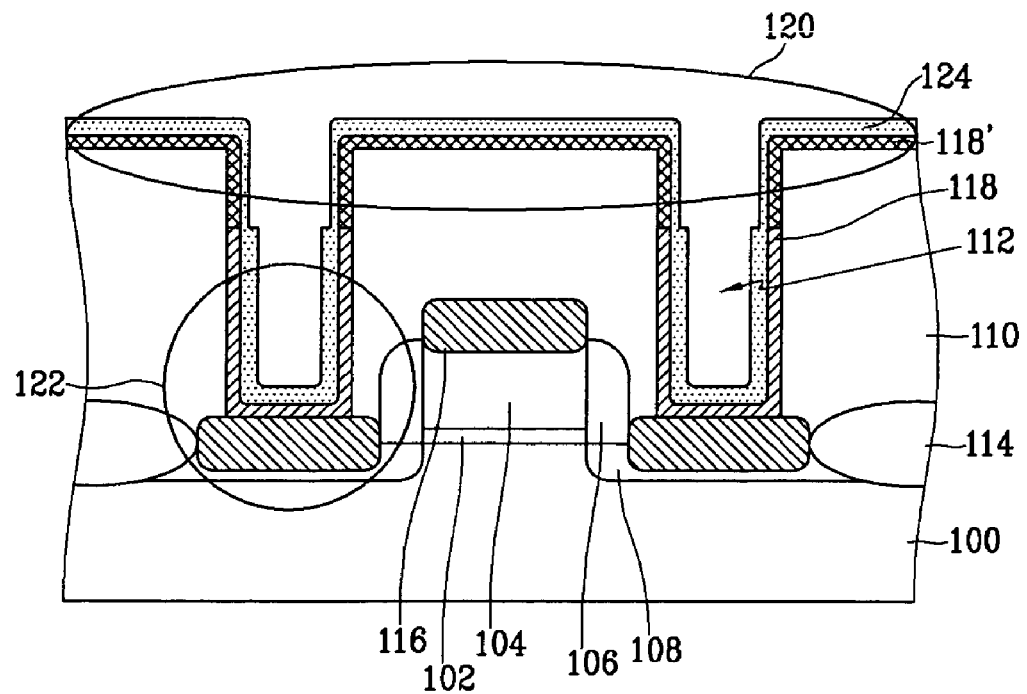
Figure 1E:
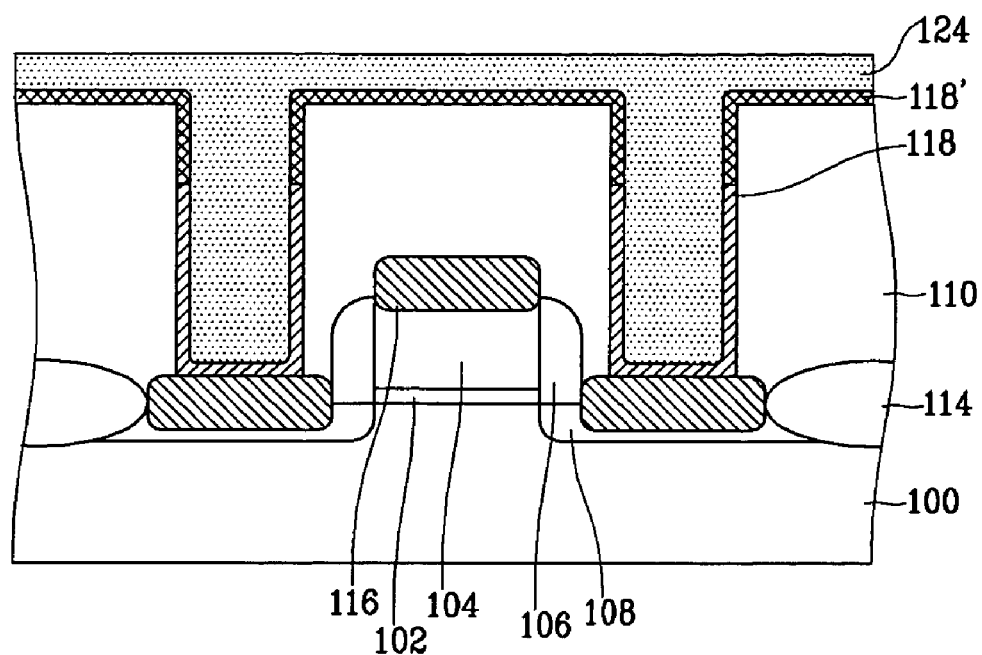

Sequentially, as shown in FIG. 1D and FIG. 1E, a conductive layer 124, for example a tungsten (W) layer, is deposited on the barrier metal layer 118 and 118' using CVD process.

At this time, as described above, the roughness of the barrier metal layer 118' at the plasma treatment area 120 is larger than that of the barrier metal layer 118 at the non-plasma treatment area 122. During gap-fill process, the number of the nucleation site of the tungsten layer increases due to the satisfactory roughness of the surface of the barrier metal layer 118' and the sizes of the seeds decrease such that the deposition speed of the tungsten layer become slower than that of the barrier metal layer at the non-plasma treatment area. Accordingly, the deposition speed of the tungsten (W) layer on the barrier metal layer 118' of the plasma treatment area is slower than on the barrier metal layer 118 of the non-plasma treatment area.

According to the above mentioned method, the step coverage of the tungsten layer can be improved, while filling the contact hole 112, so as to avoid the occurrence of the seam effect which is caused by fast deposition of the tungsten layer at the inlet rather than at the bottom of the contact hole.

Figure 1F:
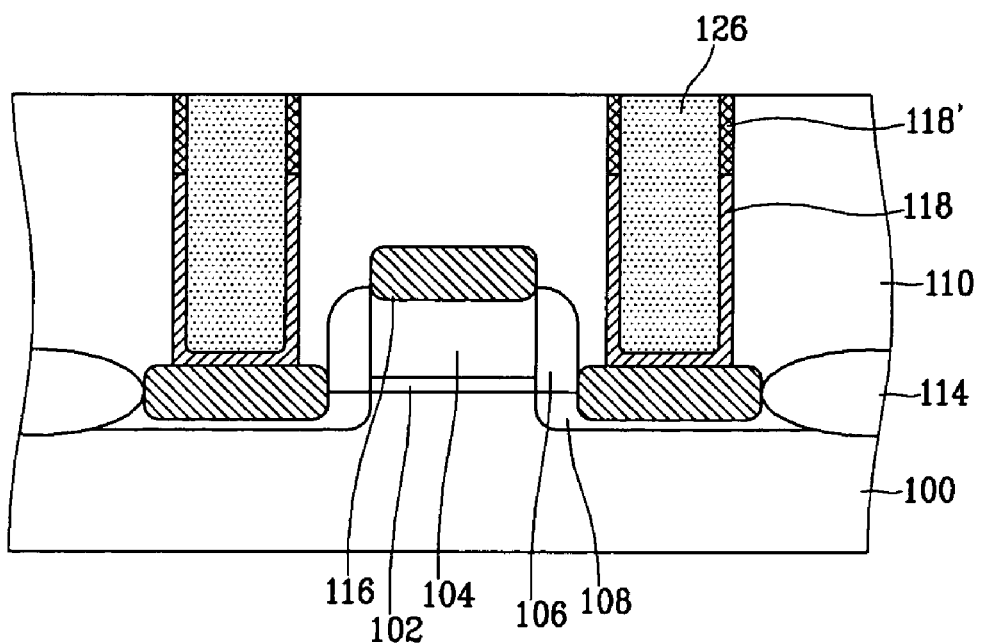

Consequently, the deposition process proceeds such that the conductive layer 124, i.e., the tungsten layer, is filled out the contact hole 112 as shown in FIG. 1E. Also, as shown in FIG. 1F, the conductive layer 124 and the barrier metal layer 118' are etched until the surface of the interlayer insulation film 110 is exposed by means of CMP process or blanket etch back process so as to for the contact 126 electrically connected to the source/drain region 108.

Not shown in the drawings, metal wires are formed so as to be electrically connected to the contact 126 after the contact 126 is formed. The conductive layer for forming the contact 126 can be copper (Cu) as well as tungsten.

As describe above, since the surface of the barrier metal layer around the inlet, in the present invention, is plasma treated so as to increase the roughness of the surface of the barrier metal layer, the conductive layer is slowly deposited around the inlet of the contact hole relative to the other area of the contact hole. Accordingly, it is possible to form the void free contact with high aspect ratio.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for fabricating a contact of a semiconductor device comprising:
    forming a dielectric layer on a semiconductor substrate;
    forming a contact hale by selectively removing the dielectric layer at positions corresponding to a source and drain;
    depositing a barrier metal layer on a surface of the dielectric layer;
    increasing roughness of a surface of the barrier metal layer at an area around an inlet of the contact hole, wherein a surface roughness at a bottom of the contact hole remains substantially unchanged;
    forming a contact by filling the contact hole with a conductive material.

2. The method of claim 1, wherein the roughness increasing step comprises exposing the surface at the area around the inlet of the contact hole to a plasma treatment.

3. The method of claim 2, wherein the plasma comprises an inert ion.

4. The method of claim 3, wherein the inert ion comprises Kr, Xe, Rn, Ar, He or $N_2$.

5. The method of claim 4, wherein the plasma treatment comprises applying a power in the range of 50~500 W and a pressure in the range of 1 mTorr~10 mTorr.

6. The method of claim 1, wherein forming a contact further comprises depositing an initial conductive layer on the barrier metal layer, wherein the initial conductive layer has a greater thickness at the bottom of the contact hole than at the area around the inlet of to contact hole.

7. The method of claim 6, wherein said initial conductive layer comprises W.

8. The meted of claim 1, further comprising depositing said conductive material on the barrier metal layer, wherein a rate of deposition is greater at the bottom of the contact hole than at the area around the inlet of the contact hole.

9. The method of claim 8, wherein said conductive material comprises W.

10. The method of claim 8, where said conductive material depositing step comprises chemical vapor deposition (CVD).

11. The method of claim 1, wherein said barrier metal depositing step comprises chemical vapor deposition (CVD).

12. The method of claim 1, wherein said barrier metal depositing step comprises physical vapor deposition (PVD).

13. The method of claim 1, wherein said contact hole has a high aspect ratio.

14. The method of claim 1, wherein said barrier metal layer comprises Ti or TiN.

15. The method of claim 1, wherein said barrier metal layer comprises a multilayered film comprising Ti and TiN.

16. The method of claim 1, further comprising annealing said barrier metal layer.

17. The method of claim 1, further comprising forming a silicide layer at a bottom surface of the contact hole.

* * * * *